United States Patent [19]
Pflueger

[11] Patent Number: 5,422,563
[45] Date of Patent: Jun. 6, 1995

[54] BOOTSTRAPPED CURRENT AND VOLTAGE REFERENCE CIRCUITS UTILIZING AN N-TYPE NEGATIVE RESISTANCE DEVICE

[75] Inventor: Randall J. Pflueger, Cambridge, Mass.

[73] Assignee: Massachusetts Institute of Technology, Cambridge, Mass.

[21] Appl. No.: 95,903

[22] Filed: Jul. 22, 1993

[51] Int. Cl.⁶ .............................................. G05F 3/08
[52] U.S. Cl. ..................................... 323/312; 323/313; 323/315
[58] Field of Search ............... 323/312, 313, 314, 229, 323/315; 307/205, 296.1, 296.5, 296.6, 296.8

[56] References Cited
U.S. PATENT DOCUMENTS

| | | | |
|---|---|---|---|
| 4,242,595 | 12/1980 | Lehovec | 307/205 |
| 4,686,449 | 8/1987 | Jeffrey et al. | 323/231 |
| 4,686,451 | 8/1987 | Li et al. | 323/313 |
| 4,760,284 | 7/1988 | Taylor | 323/313 |
| 4,868,416 | 9/1989 | Fitzpatrick et al. | 307/296.8 |
| 4,948,989 | 8/1990 | Spratt | 307/296.6 |
| 4,954,769 | 9/1990 | Kalthoff | 323/313 |
| 5,008,565 | 4/1991 | Taylor | 307/296.7 |
| 5,065,043 | 11/1991 | Bartling | 307/296.8 |
| 5,099,191 | 3/1992 | Galler et al. | 323/313 |
| 5,281,871 | 1/1994 | Mori et al. | 307/454 |

OTHER PUBLICATIONS

Yang, H. C. and D. J. Allstot, "Improved Self-Boot-Strapped Gain Enhancement Technique For GaAs Amplifiers", *Electronics Letters*, vol. 24, No. 17, Aug. 18, 1988, pp. 1101-1102.

*Primary Examiner*—Steven L. Stephan
*Assistant Examiner*—Adolf Berhane
*Attorney, Agent, or Firm*—Samuels, Gauthier & Stevens

[57] ABSTRACT

A bootstrap current reference circuit having an n-type negative resistance network, and a biasing device responsive to operating current of the n-type negative resistance network for biasing the network to operate as a current source at an operating point substantially in a region of a predetermined current peak associated with the n-type negative resistance network. In one embodiment the circuit includes a depletion-mode FET (DFET) and a stable trimmed n-type negative resistance device (ST-NNRD) connected in series with the source of the DFET. The gate of the DFET is feedback coupled to the output of the ST-NNRD so as to bias it in a region of operation in which it exhibits a large incremental resistance, thus bootstrapping the circuit to operate in a state substantially independent of fluctuations associated with supply voltage source. In an alternate embodiment, the circuit includes a ST-NNRD connected in series with the source terminal of a DFET. The DFET is one side of a current mirror with a second DFET, the current mirror being terminated by an impedance providing level matching and monostable loading of the ST-RTD.

20 Claims, 7 Drawing Sheets

BOOTSTRAPPED CURRENT AND VOLTAGE REFERENCE CIRCUITS UTILIZING AN N-TYPE NEGATIVE RESISTANCE DEVICE

BACKGROUND OF THE INVENTION

The invention relates generally to n-type negative resistance device (NNRD)-bootstrapped current sources, and to NNRD-bootstrapped voltage references derived from the current sources. The invention relates more specifically to embodiments of NNRD-bootstrapped DFET current sources, one being a self-bootstrapped reference, the other bootstrapping an NNRD in relation to a load impedance through an additional circuit constraint imposed by a current mirror.

In many material systems or device technologies current- and voltage-source devices exist as highly imperfect approximations which do not enable generation of stable, well regulated, precision signals. Compared with silicon, GaAs in particular, and the III-V compounds and alloys in general, do not at present permit fabrication of devices enabling generation and maintenance of precision signal levels. Voltage-source devices such as Zener diodes are of low quality in these materials and are not process-compatible with fabrication of active devices. Current-source devices such as MESFETs exhibit a high degree of threshold voltage instability and drain-source conductance, and relatively low gain, rendering them unsuitable as the basis for precision current source circuits. GaAs Heterojunction Bipolar Transistors (HBTs) exhibit smaller conductance than GaAs MESFETS and HBT technology may be suitable for either bandgap or Vbe reference circuits. However, HBT reference circuits exhibiting the capability for stability and precision found in silicon reference circuits have not yet been demonstrated or proposed.

At present, existing monolithic voltage GaAs MESFET references can support 8 to 10 bits of precision in high-speed digital-to-analog (D/A) converters. To extend the precision of D/A conversion in these inherently high-speed technologies to levels achieved in silicon integrated circuits (operating at lower frequencies), one requirement is to provide improved integrated current and voltage references. The impending monolithic integration of resonant tunneling diodes (RTDs) with GaAs MESFET transistors provides a new means for providing, within a high-speed GaAs MESFET integrated circuit, a device with current-source properties which can be exploited to yield a constant current in the presence of large fluctuations in supply voltage. This is achieved by using high-gain amplification to bootstrap the operating point of the reference circuit to the local, high resistance operating point of the RTD.

Silicon integrated circuit technologies typically incorporate bipolar devices such as forward biased p-n junction diodes for precision level shifting, and derive reference voltages proportional to breakdown voltages in Zener diodes, or to the bandgap energy of the host semiconductor. In other integrated circuit technologies such as those employing GaAs MESFETs, heterojunction bipolar transistors, MODFETs (or HEMTs), voltage references with a high degree of supply rejection (similar to that obtained in precision silicon circuits) have not yet been demonstrated.

FIG. 1 shows an example of a GaAs integrated circuit representative of prior art found in U.S. Pat. No. 4,686,451 issued to Li et al. for "GaAs Voltage Reference Generator", implementing Schottky diodes D1, D2, D3, D4, and MESFETS M1 and M2. For the case that the diode conductances $g_{D1} \simeq g_{D2} \simeq g_{D3} \simeq g_{D4}(\simeq g_D)$ are all of the same order as the transistor transconductances $g_{m1} \simeq g_{m2}(\simeq g_m)$, and that the transistor drain-source conductances $g_1 \simeq g_2(\simeq g)$ stand in the relation $g_m \simeq g_D > g$, then the fractional shift in the reference voltage due to supply fluctuations is $$\frac{\Delta V_{ref}}{\Delta V_{dd}} = \frac{2}{3} \cdot \frac{g^2}{g_m g_D} \qquad (1)$$

The supply rejection for operative circuits of the type shown in FIG. 1 is approximately 50 db. Equation (1) indicates that the regulation can only be improved by either increasing device areas, at the expense of increasing power dissipation, or by turning on the devices to a greater degree at the expense of requiring larger supply voltage.

It will be appreciated by those of skill in the art that this method of bootstrapping is inefficient in the sense that the series gate-source connection employed in circuits described by Yang and Allstot, "Improved Self-bootstrapped Gain Enhancement Technique for GaAs Voltage Reference Generator" and in U.S. Pat. No. 4,686,451, between nodes A and B of FIG. 1, is a low impedance port. Connecting forward biased (thermionic) diodes at this port results in a bootstrapped operating point which depends upon the intersection of two low-impedance loadlines. Independent shifts in either loadline result in large changes in the state of the circuit. This is in contrast to the case of a high impedance device biased by a low impedance loadline, where independent shifts in the loadline create minimal shifts in the state of the high-impedance device/network.

It should further be observed that forward-biased Schottky diodes do not exhibit the abrupt turn-on shown by similarly biased p-n junction diodes, since current conduction in the former is by a combination of tunneling (soft turn-on) and thermionic emission (hard turn-on), while in the latter the current is conducted by thermionic emission only (for non-degenerately doped devices). Therefore, the gate-source voltages, and hence the currents, will shift substantially in response to changes in supply voltage.

SUMMARY OF THE INVENTION

One object of the invention is to provide a stable bootstrap current reference source having reduced sensitivity to supply fluctuations and noise.

Accordingly, a bootstrap current reference circuit is provided which includes an n-type negative resistance network, and a biasing means responsive to operating current of the n-type negative resistance network for biasing the network to operate as a current source at an operating point substantially in a region of a predetermined current peak associated with the n-type negative resistance network.

DETAILED DESCRIPTION OF THE ILLUSTRATED EMBODIMENTS

The principles of design of the present invention are described for exemplary purposes with reference to a particular type of DFET, an n-channel depletion-mode GaAs MESFET, and with reference to a particular type of NNRD, and RTD, exhibiting properties expected to be typical of devices integrable with GaAs MESFETs. It will occur to those skilled in the art that the DFET circuits can be implemented using p-channel devices with minimal changes to the circuits.

A general feature of the current and voltage reference circuits described herein is the imposition of an additional constraint in addition the normal constraints on loop voltages (KVL) and currents (KCL), via feedback or bootstrapping, which has the effect of creating at least one stable operating point in addition to the zero state. The additional state(s) are stable, meaning substantially invariant, with respect to variation in supply voltage $V_{dd}$.

Figure 1:
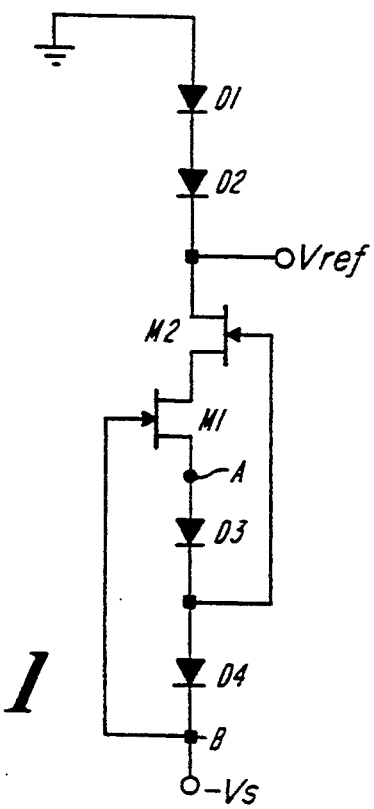
FIG. 1 shows a prior art voltage reference generator.
Figure 2A:
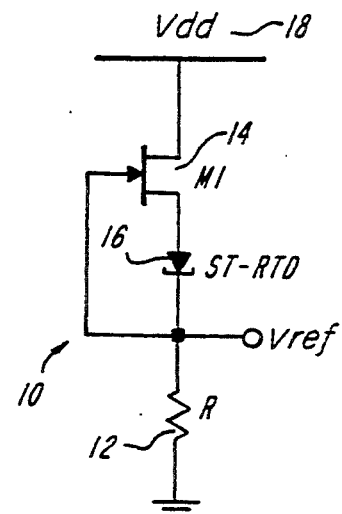
FIGS. 2A shows a bootstrap current reference circuit in accordance with the present invention.

With reference now to FIG. 2A, a bootstrapped current reference circuit 10 is shown. The circuit 10 is connected in series with a stable precision resistor 12 to form a voltage reference generator. According to the illustrated embodiment, the current reference circuit 10 includes a depletion-mode FET (DFET) 14 and an NNRD 16 such as a p-n junction tunnel diode (TD) or resonant tunneling diode (RTD), for example a stable trimmed RTD (ST-RTD), connected in series with the source of the DFET. The gate of the DFET is feedback coupled to the output of the NNRD-RTD 16 so as to bias the NNRD in a region of operation in which it exhibits a large incremental resistance, thus bootstrapping the circuit 10 to operate in a state substantially independent of fluctuations associated with supply voltage source 18. The ratio of DFET gate length to DFET gate width is selected, in accordance with equation (2) below, so that at a gate potential equal to $V_{op}$ below the potential of the DFET source, the DFET conducts current equal to $I_{op}$. Accordingly, the drain-source impedance of the DFET is improved by a factor proportional to the resistance of the ST-NNRD, and the voltage drop across the drain-source terminals of the DFET varies in accordance with maintaining a substantially constant voltage across the ST-NNRD.

The DFET geometry W/L is chosen to bias the ST-NNRD at $\{I_{op}, V_{op}\}$ for a design supply voltage $V_{ds1}=V_{dd}$. From a simple square-law model for the drain-source current, W/L is written as $$\frac{W}{L} = \frac{I_{op}}{\beta(-V_{op} + |V_{th}|)^2(1 + \lambda(V_{dd} - I_{op}R - V_{op}))} \quad (2)$$

The choice of W/L is restricted by the requirements that the transistor operate in the forward-active mode, with $V_p < |V_{th}|$ and $V_{dd} > (-V_p + |V_{th}|)$, and that the ST-NNRD loadline is monostable.

Figure 2B:
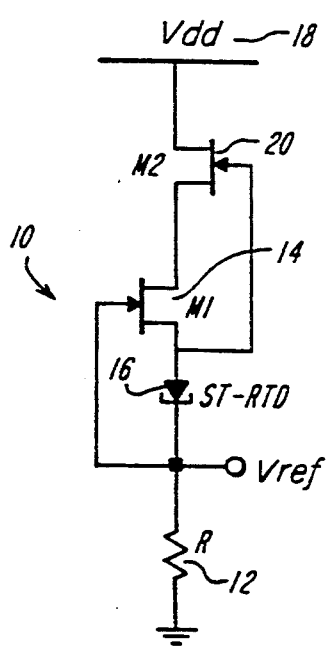
FIGS. 2B and 2C respectively show the bootstrap current reference circuit with a single and a double cascode configuration.

In an alternate embodiment shown in FIG. 2B, a second DFET 20 is connected in series with the first DFET 14 in a cascode configuration, wherein the source of the second DFET 20 is connected to the drain of the first DFET 14, and the gate of the second DFET 20 is connected to the source of the first DFET 14, thus causing the drain-source voltage of the second DFET 20 to vary in accordance with maintaining a substantially constant voltage drop across the drain-source terminals of the first DFET 14.

Figure 2C:
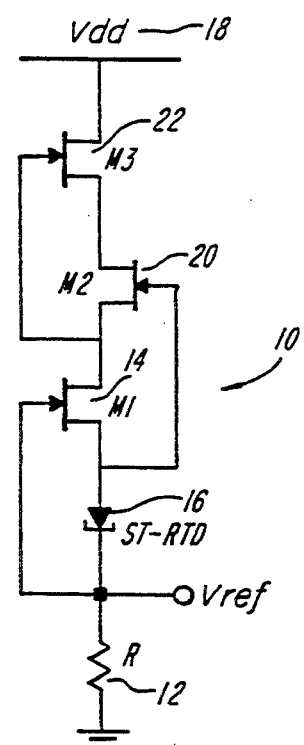

In an further embodiment shown in FIG. 2C, a third DFET 22 is connected in series with the second DFET 20 as an additional cascode device, wherein the source of the third DFET 22 is connected to the drain of the second DFET 20, and the gate of the third DFET 22 is connected to the source of the second DFET 20, so that the drain-source voltage of the third DFET varies with fluctuations in the supply voltage in accordance with maintaining a substantially constant voltage across the drain-source terminal of the second DFET.

Figure 3:
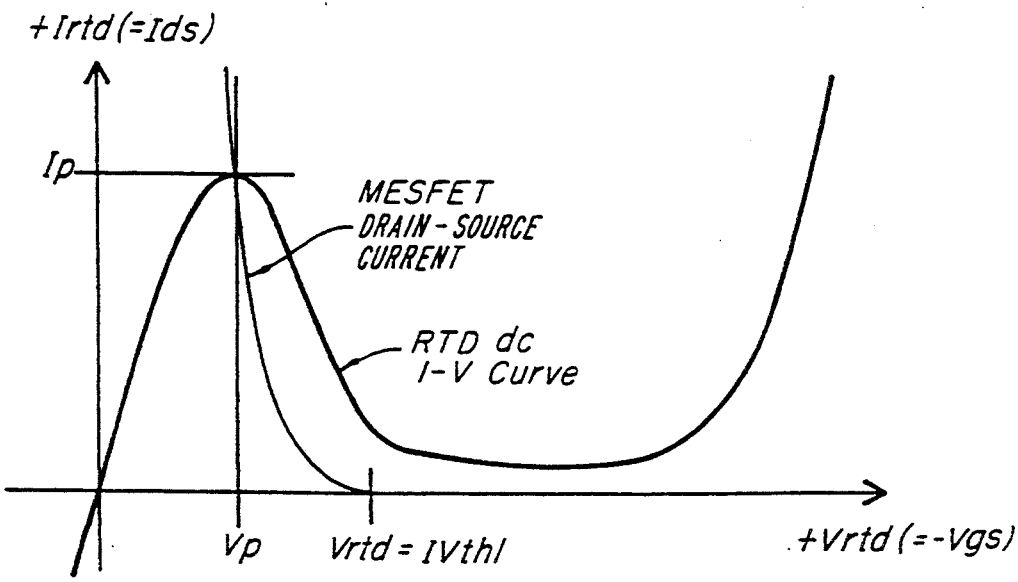
FIG. 3 shows a graphical solution for the operating point of an RTD utilized in the bootstrap current reference circuit illustrating the intersection of a DFET drain-source current with the RTD I-V curve, for a DFET designed to intersect at {Ip, Vp}.

The bootstrapping feedback responsible for the additional stable operating point arises by imposing the constraints that the current through the DFET M1 should be identical to the current in the ST-NNRD, and that the gate-source voltage controlling M1 ($V_{gs1}$) be equal to $(-V_{NNRD})$. A graphical solution for the operating point is demonstrated in FIG. 3, showing the intersection of the DFET drain-source current with the NNRD I-V curve, for a DFET designed to intersect at (Ip, Vp). The consequences of incorporation of a gate-source connected NNRD on the differential voltage gain $dV_{gs}/dV_{ds}$ and output impedance $dV_{ds}/dI_{ds}$ are described hereinafter.

Approximating $I_{ds}$ via a square law relation $$I_{ds} = \beta \frac{W}{L} (V_{gs} - V_{th})(1 + \lambda V_{ds}) \qquad (3)$$

the derivative $dV_{gs}/dV_{ds}$ along the state trajectory of M1 in the $\{V_{gs}, V_{ds}\}$ plane is given by $$\frac{dV_{gs}}{dV_{ds}} = \left(\frac{\lambda}{2}\right) \frac{V_{th} - V_{gs}}{(1 + \lambda V_{ds}) + \frac{g_{NNRD}}{2K(V_{gs} - V_{th})}} \qquad (4)$$

Figure 4:
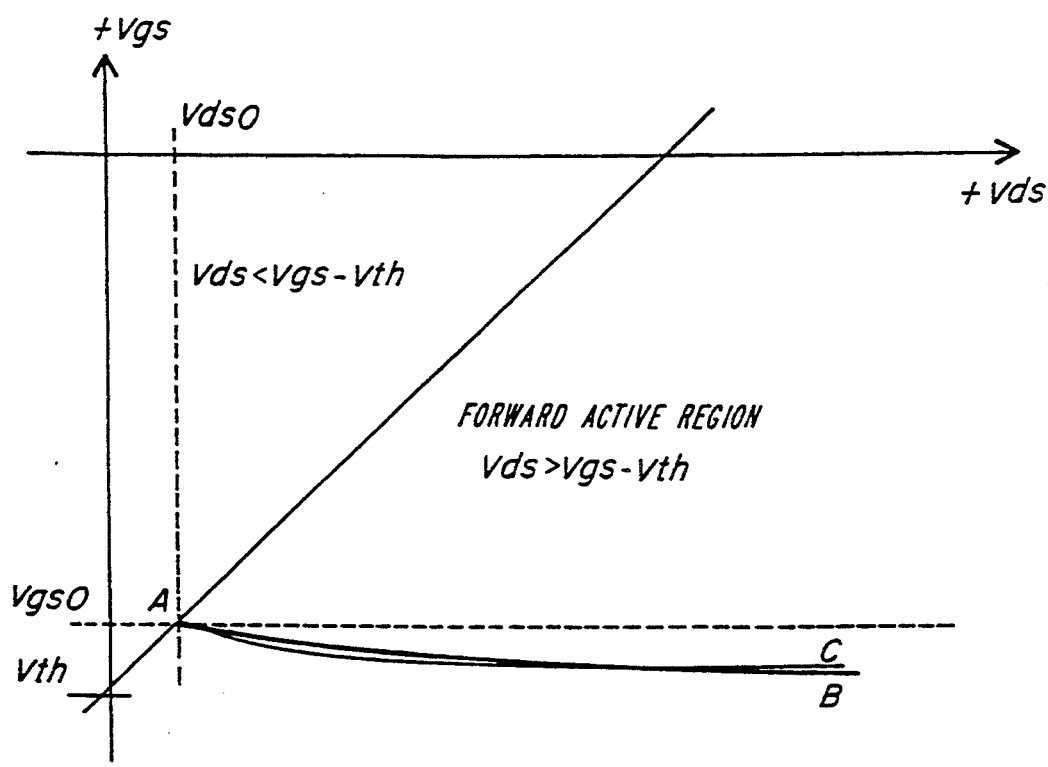
FIG. 4 shows the trajectory $V_{gs}$, $V_{ds}$ corresponding to driving an RTD-bootstrapped DFET from A→B, compared with the trajectory obtained from a DFET-bootstrapped by a perfect current source (curve A→C), after the current sources of FIG. 2A.

An example of the trajectory is the line A-B in FIG. 4. This should be compared with trajectory A-C, giving the locus of ($V_{gs}$, $V_{ds}$) corresponding to a particular (constant) value of the drain-source current. Comparison of the two trajectories indicates that for $g_{NNRD} > 0$ the NNRD circuit exhibits higher $V_{ds}$ gain than for a perfect, gate-source connected current source, while for $g_{NNRD} < 0$ the NNRD reference exhibits somewhat less voltage gain than does the perfect current source. This deficiency is remedied through the addition of cascode stages which limit the set of NNRD operating points to the region of the peak. Letting $g_{NNRD} \to 0$ everywhere, as in the case of a perfect current source, then equation (4) gives the derivative $dV_{gs}/dV_{ds}$ at any point on the constant $I_{ds}$ locus (A-C), $$\frac{dV_{gs}}{dV_{ds}} = \frac{\lambda}{2} \frac{V_{th} - V_{gs}}{1 + \lambda V_{ds}} \qquad (5)$$

The output impedance is found by incorporating constraints 1 and 2, which can be expressed as $$I_{ds} = I_{NNRD} = -|\Gamma|(-V_{gs} - V_p)^2 + I_p \qquad (6)$$

in equation (2). Solving for $V_{gs}$ in equation (5) yields $$V_{gs} = -V_p - \left(\frac{I_p - I_{ds}}{|\Gamma|}\right)^{\frac{1}{2}} \qquad (7)$$

Substituting from equation (6) into equation (2) gives $$\frac{W}{L} = \frac{I_{op}}{\beta(-V_{op} + |V_{th}|)^2(1 + \lambda(V_{dd} - I_{op}R - V_{op}))} \qquad (8)$$

Implicit differentiation of this relation with respect to $V_{ds}$ permits solution for $dV_{ds}/dI_{ds}$ as $$\frac{dV_{ds}}{dI_{ds}} = \frac{1 + \beta \frac{W}{L}\left(\frac{V_p + V_{th}}{|\Gamma|^{\frac{1}{2}}(I_{ds} - I_p)^{\frac{1}{2}}} + \frac{1}{|\Gamma|}\right)(1 + \lambda V_{ds})}{\beta \frac{W}{L}\left[\left(\frac{I_{ds} - I_p}{|\Gamma|}\right)^{\frac{1}{2}} + V_p + V_{th}\right]^2 \lambda} \qquad (9)$$

The limiting form of this equation, in the case that $I_{ds} \to I_p$ is $$\frac{dV_{ds}}{dI_{ds}} = \frac{1 + \lambda V_{ds}}{\lambda |\Gamma|^{\frac{1}{2}}(I_{ds} - I_p)^{\frac{1}{2}} V_p + V_{th}} \qquad (10)$$

Then as $\Gamma \to 0$, $dV_{ds}/dI_{ds} \to \infty$. The implication is that for operating points near the peak current, the circuit exhibits an extremely high output impedance, corresponding to an extremely large voltage gain for small changes in $I_{ds}$. Addition of cascoding improves $I_{ds}$ regulation by two mechanisms: (1) increasing the output resistance as in conventional circuits, and (2) buffering of supply variations, ensuring that the high gain of the first stage is realized by maintaining the operating close to the peak. The previous description demonstrates that the imposition of the constraints above establish a state of the circuit which is substantially invariant to supply voltage fluctuations.

The cascode stages utilized in FIGS. 2B and 2C isolate the ST-NNRD current source from supply fluctuations at the expense of requiring larger supply voltages to drive the DFETs in the forward active mode. As shown, the reference voltage is generated with respect to the negative supply rail. Connecting a resistor between the positive rail and the current source results in a reference voltage with respect to the positive rail.

Figure 5:
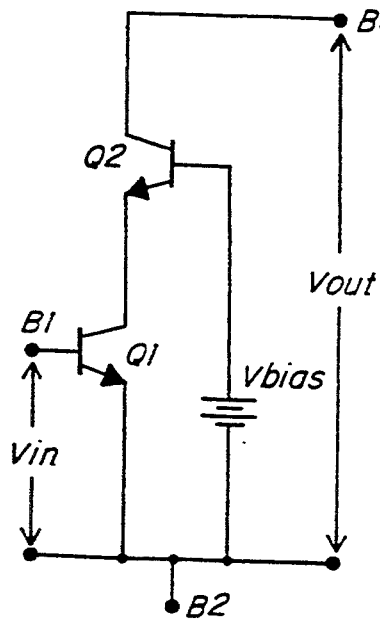
FIG. 5 shows a basic common-emitter common-base (CE-CB) cascode configuration implemented with bipolar devices.

FIG. 5 illustrates a basic common-emitter common-base (CE-CB) cascode configuration implemented with bipolar devices. The external voltage source labeled $V_{bias}$ is for level shifting to forward bias the two base-emitter junctions, and corresponds to the sum of the built-in voltage $V_{th}$ in depletion-mode MESFETs with additional dc level shifting which may occur between the gate and the common connection shared by the input and output ports of the cascode. It will be apparent to those skilled in the art that the voltage gain at the output is proportional to the product of the voltage gains of the separate transistors established by the respective operating point of each transistor.

It will suffice to point out the input and output nodes of the cascode stages employed in circuits of FIGS. 2A–2C to establish the application of cascode enhancement of output resistance in these circuits. The input, output and ground nodes shown in FIG. 6, labeled B1, B3 and B2 respectively, are illustrated for each additional level of cascoding in the circuits of FIGS. 2B, and 2C. In FIG. 2B, B1 is the gate electrode of M1, B2 is the drain electrode of M2, and B3 is the source electrode of M1. In FIG. 2C for the second level of cascoding, B1 is the gate electrode of M2, B2 is the drain electrode of M3, and B3 is the source electrode of M2.

Figure 6A:
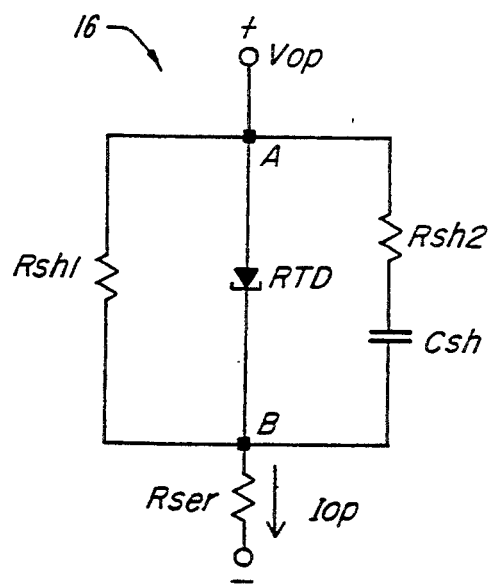
FIGS. 6A and 6B respectively show circuit details of an ST-RTD, together with the small signal dc equivalent circuit for an RTD.
Figure 6B:
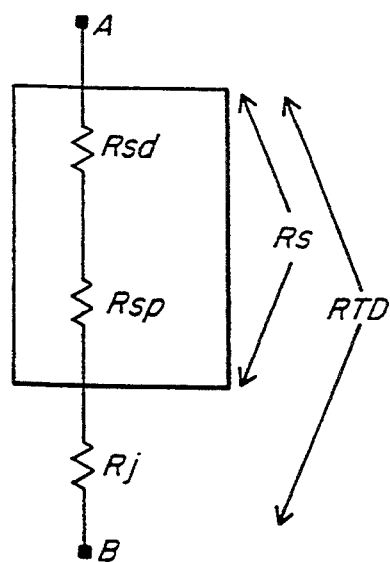

Circuit details of the ST-NNRD 16 are shown in FIG. 6A, together with the small signal dc equivalent circuit for an NNRD shown in FIG. 6B. Contained in this subcircuit are a potentially stable NNRD and a lossy ac shunt resistor $R_{sh2}$ to prevent high-frequency oscillation, together with resistors $R_{sd}$, $R_{sh1}$ and $R_{ser}$ for trimming the ST-NNRD terminal characteristics. Denoting the dc dynamic resistance of the tunnel barrier by $R_j$ and the series resistance of the adjacent semiconductor substrate by $R_s$ ($=R_{sp}+R_{sd}$), then with $R_{sh1} > |R_s + R_j|$ the ST-NNRD exhibits a local maxima in the I-V curve at $\{I_p, V_p\}$. $R_{sp}$ is the parasitic resistance of the semiconductor substrate and space charge layers adjacent to the barriers, and $R_{sd}$ is the design augmentation to $R_s$ for purposes of trimming the ST-NNRD terminal characteristics. For $R_{sh1} = \infty$ and $R_{sd} = R_{ser} = 0$, the ST-NNRD peak point is ($I_p$, $V_p$), the same as that of the NNRD alone. The design operating point of the ST-NNRD embedded in the reference circuit 10 is denoted ($I_{op}$, $V_{op}$), and the dynamic resistance of the network at this operating point is $R_{dyn}$.

The gate-source connection provides the ST-NNRD with a low impedance bias source. Denoting the gate-source and drain-source transconductances by $g_{mi}$ and $g_i$, respectively, then for the case of 0 or 2 cascode stages the equivalent impedance presented to the ST-NNRD is $$R_{Thev} = \frac{1}{g_{m1}} = R\frac{g_1}{g_{m1}} \quad (11)$$

For the case of a single cascode stage the terms containing R cancel, yielding $R_{Thev}=1/g_{m1}+(g_1/g_{m1})(1/g_{m2})$. For the circuit 10, $0<R_{g1}<<1$ and $g_1/g_{m1}<<1$, so that the second term in these expressions for $R_{Thev}$ can be neglected. Then the requirement that the loadline is monostable is expressed as $$g_{m1} > \frac{1}{|R_{dyn}^{min}|} \quad (12)$$

where $$R_{dyn}^{min} = \frac{(R_j^{min} + R_s)R_{sh1}}{R_j^{min} + R_s + R_{sh1}} + R_{ser} \quad (13)$$

and $R_j^{min}$ are the minimum dynamic resistances in the negative resistance region (NDR) of the ST-NNRD and the NNRD, respectively. Substitution for $g_{m1}$, from equation (12), in the square-law result $I_{ds1}=(g_{m1}/2)(V_{gs1}-V_{th})$, yields a further constraint relating ST-NNRD and DFET parameters required for forward-active operation of $M_1$.

$$I_{op} = \frac{(-V_{op} + |V_{th}|)}{2} \cdot g_m > \frac{(-V_{op} + |V_{th}|)}{2|R_{dyn}^{min}|} \quad (14)$$

For the case that $V_{op} \simeq V_p$ and $I_{op} \simeq I_p$, then Equation (14) implies that the minimum value of $V_p$ for which monostable loading of the ST-NNRD throughout the region of the current peak is possible is $V_p \geq |V_{th}| - 2|R_{dyn}^{min}| I_{op}$. For MESFETs used in the SPICE simulations that follow $V_{th}= -0.825$ V, while the RTDs are scaled for $R_{dyn} \simeq 15 \Omega$ and $I_p=0.010$ A. Then the minimum value of $V_p=0.425$ V, which effectively precludes all p-n junction tunnel diodes. It is important to note that the these results are expressed in the context of the square-law model for $I_{ds1}$, so that the range of the inequality may change slightly with implementation of more sophisticated models.

Suppose that $R_{dyn}^{min}$ changes little for $V_p \in \{0.060 \text{ V}, 1.0 \text{ V}\}$. For the case of an RTD with $R_{dyn}^{min} \simeq 15 \Omega$, $I_{op}=0.010$ A and $V_{op} \simeq V_p = 0.700$ V, the inequality evaluates to $0.010>0.0042$, consistent with operation of M1 in forward-active mode.

For the case of a germanium TD with $R_{dyn}^{min} \simeq 15 \Omega$, $I_{op}=0.010$ A and $V_{op} \simeq V_p=0.070$ V. Then for $V_{th}=-0.825$ V the inequality in equation (14) evaluates to $0.010>0.025$, which is inconsistent with operation of M1 in forward-active mode. Since $R_{dyn}^{min} \propto 1/I_p$ approximately, it is not possible to adjust $I_p$ to satisfy this constraint for the case of the TD postulated above. In the case of TDs, it is necessary to utilize another type of bootstrap circuit to force operation in the region of the current peak.

The curvature coefficient $\Gamma$ is defined through the relation $I_{nnrd}=\Gamma \times (V-V_p)^2+I_p$. For TDs and RTDs $\Gamma$ increases with $I_p$ and decreases with $V_p$, suggesting that a reasonable estimate for $\Gamma$ may be obtained from $\Gamma=K \ I_p/V_p$. Fitting this expression to data on RTDs and germanium TDs yields $K=-10.5 \text{ V}^{-1}$. For $V_P=0.7$ V and $I_p=0.01$ A, $\Gamma=-0.150$ A/V$^2$.

Cascode stages stabilize the voltage driving the ST-NNRD and improve $V_{dd}$ rejection. Letting $N=1+n_c$, with $n_c$ being the number of cascode stages, the supply rejection is given by $$\frac{\Delta V_{ref}}{\Delta V_{dd}} = R \cdot g_{NNRD} \cdot \prod_{i=1}^{N} \frac{g_i}{g_{mi}} \quad (15)$$

The improvement in regulation due to cascoding is not due merely to the additional factors of $g_i/g_{mi}$. Forcing $V_{gs1} \simeq V_p$ assures that $g_{NNRD}=2\Gamma(V-V_p)$ assumes vanishingly small values. The ST-NNRD and associated DFET(s) can be considered to comprise a negative resistance network exhibiting an effective curvature coefficient $\Gamma'$ with respect to $V_{dd}$ given by $$\Gamma' = \Gamma \times \left[ \prod_{i=1}^{N} \frac{g_i}{g_{mi}} \right]^2 \quad (16)$$

These results indicate that the circuits of FIGS. 2A–2C comprise a family of progressively more accurate current sources, connected in series with a stable resistance to generate a reference voltage. Switching the position of the current source and resistor generates $V_{ref}$ relative to the upper supply rail.

Figure 7A:
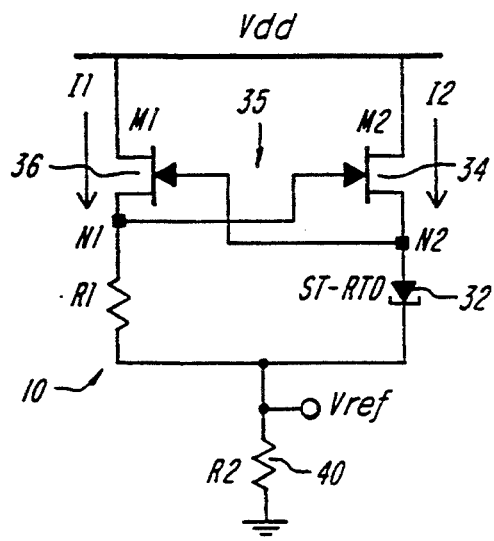
FIGS. 7A shows an alternate embodiment of a bootstrap current reference circuit including a negative inverting current mirror.
Figure 7B:
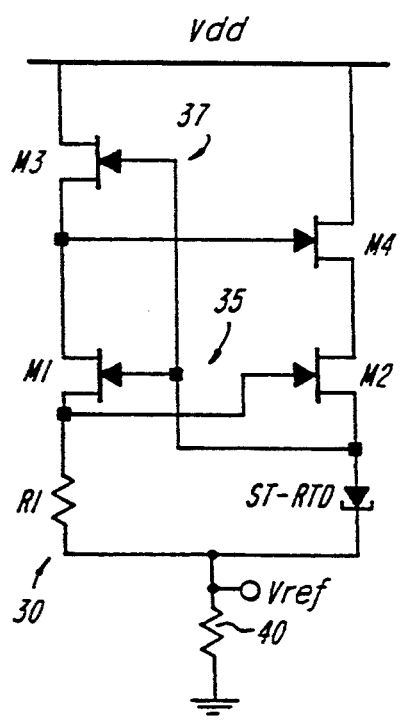
FIGS. 7B and 7C respectively show the bootstrap current reference circuit of FIG. 7A with a single cascode and a double cascode configuration.
Figure 7C:
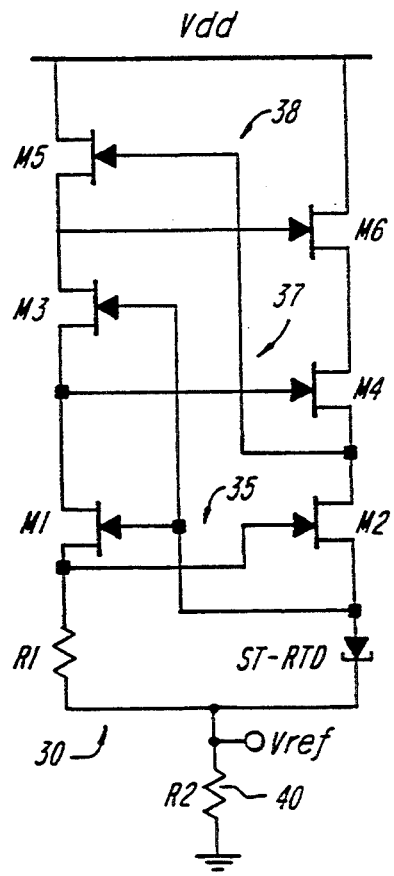

FIGS. 7A–7C show embodiments of NNRD current reference circuits based upon a negative inverting current mirror. Cascode versions utilize a double level-shifting technique. The reference voltage is derived from the sum of the currents in each side of the mirror passing through summing resistor R2.

According to the embodiment shown in FIG. 7A, a bootstrap current reference circuit 30 includes an NNRD 32, such as a TD or RTD, connected in series with the source terminal of a DFET 34. The DFET 34 comprises one side of a current mirror 35 having a second DFET 36, the current mirror being terminated by an impedance providing level matching and monostable loading of the NNRD. The constraints imposed by the mirror on the current through the terminating impedance and the voltage across the NNRD act in accordance with biasing the NNRD in a region of operation in which it exhibits a large incremental resistance, thus bootstrapping the circuit 30 in a state substantially independent of supply voltage fluctuations. Accordingly, the drain-source impedance of the DFET 34 is improved by a factor proportional to the resistance of the NNRD, and the voltage drop across the drain-source terminals of the first DFET varies in accordance with maintaining a constant voltage across the NNRD.

In an alternate embodiment shown in FIG. 7B, a cascode amplifier stage 37 is added to the current mirror 35 of the previous embodiment, to improve the impedance of the current mirror with respect to variation in the supply voltage, in accordance with maintaining a constant drain-source voltage across the DFETs 34 and 36.

In a further exemplary embodiment shown in FIG. 7C, a second cascode amplifier stage 38 is incorporated with the first stage 37 and the current mirror 35 for biasing the NNRD and the level matching load impedance, to further improve the voltage stability across the NNRD. A second impedance 40, preferably a diode or a resistor, is placed in series with the summed currents from both sides of the mirror to produce a reference voltage output.

In terms of a square-law model, noting that $V_{ds1} = V_{dd} - I_{ds1}R_1$ and $V_{gs1} = V_{NNRD} - I_{ds1}R_1$, $I_{ds1}$ is $$I_{ds1} = \frac{\beta_1 \frac{W_1}{L_1}(V_{NNRD} - I_{ds1}R_1 - V_{th1})^2(1 + \lambda_1 V_{dd})}{1 + \beta_1 \frac{W_1}{L_1}(V_{NNRD} - I_{ds1}R_1 - V_{th1})^2 \lambda_1 R_1} \quad (17)$$

Similarly, noting that $V_{ds2} = V_{dd} - V_{NNRD}$, $I_{ds2} = I_{NNRD}$, and that symmetric cross coupling of $M_1$ and $M_2$ requires that $V_{gs2} = -V_{gs1}$, $$I_{NNRD} = \qquad\qquad\qquad\qquad\qquad (18)$$

$$\beta_2 \frac{W_2}{L_2}(I_{ds1}R_1 - V_{NNRD} - V_{th2})^2(1 + \lambda(V_{dd} - V_{NNRD}))$$

which specifies $I_{ds1}$ in terms of device parameters and the nominal value of the supply voltage. Using equation (18) to eliminate $I_{ds1}$ from equation (17) permits specification of the dimensions of $M_1$ as a function of $M_2$ dimensions and the supply voltage $V_{dd}$. A lower bound on $V_{dd}$ is found by requiring that all active devices operate in the forward active mode, or $V_{ds} > (V_{gs} - V_{th})$.

Bootstrapping the circuit 30 to realize a non-zero stable operating point substantially independent of the supply voltage is achieved by imposing the mirror ratio on the NNRD bias loop. This permits solution of the loop equations independent of the supply voltage. Equations (17) and (18) together specify the state of the reference circuit 30 in FIG. 7A. Those skilled in the art will appreciate that analysis similar to that presented for circuit 10 can be provided from the equations. The specific approach described for deriving the reference voltage, ie. $V_{ref} = (I_{ds1} + I_{ds2}) \times R$, is sensitive to fluctuations in each component of the total current. However, means are described herein for using this technique to improve upon the regulation obtained from existing MESFET voltage reference generators.

Figure 8:
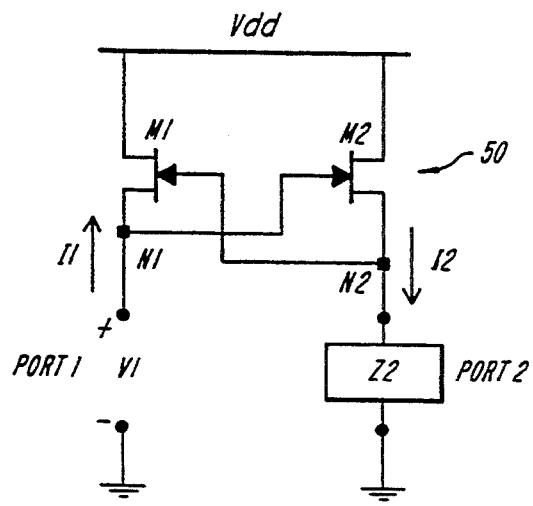
FIG. 8 shows a Thevenin equivalent impedance for a current mirror.

FIG. 8 shows a Thevenin equivalent impedance for a current mirror 50. The Thevenin equivalent impedance at port 1 of the current mirror 50 depends on the properties of small-signal inversion, and voltage following. Impressing test current $I_1$ results in a decrease in the magnitude of the gate-source voltage $V_{gs1}$ resulting in gate-source voltage $V_{gs2}$ of opposite sign due to the inverting property of the current mirror. $|I_2| = |I_1| \cdot g_{m2}/g_{m1}$ is induced with the polarity shown, resulting in voltage $V_2$ at node $N1$ of $|V_2| = Z_2 \cdot |I_1| \cdot g_{m2}/g_{m1}$, and having the same sign as $V_{gs2}$. Then $V_1(=V_{g2})$ is given by $$V_1 = I_1 \frac{g_{m1}}{g_{m2}} Z_{L2} + \frac{I_1}{g_{m1}} \quad (19)$$

in the same direction as $I_1$, so that $$R_{Thev1} \equiv \frac{V_1}{I_1} = \frac{g_{m2}}{g_{m1}} Z_2 + \frac{1}{g_{m1}} \quad (20)$$

Similarly, looking into port 2 of a mirror terminated at port 1 with $Z_1$, $$R_{Thev2} = \frac{g_{m1}}{g_{m2}} Z_1 + \frac{1}{g_{m2}} \quad (21)$$

The symmetry of this result is required by the symmetric coupling of $M_1$ and $M_2$, and also applies (to first order) to the single- and double-cascode circuits in FIGS. 2B and 2C. As opposed to the case of the reference circuit 10, the two terms which comprise $R_{Thev1}$ and $R_{Thev2}$ are of comparable magnitude in some cases and are retained in determining the incremental loadline.

From equation (21), the requirement that the loadline in the current mirror references of FIGS. 7A–7C is monostable is expressed as $$\frac{g_{m2}}{1 + g_{m1}R_1} > \frac{1}{|R_{dyn}^{min}|} \quad (22)$$

where $R_{dyn}^{min}$ is determined by eqn. 13 and $Z_1 = R_1$. It is clear from equations (12) and (14) that minimization of $R_1$ results in an expanded domain of NNRD operating points for a particular DFET technology through a reduction in feedback to the RTD due to voltage following. For $g_{m1}R_1 << 1$, equation (22) reduces to the constraint in equation (12).

For the current mirror 35 in FIG. 7A, calculation of $\Delta V_{ref} = R_2\{\Delta(I_{R1} + I_{NNRD})/\Delta V_{dd}\}$, for the case that $R_1 g_1 << 0$, yields $$\frac{\Delta V_{ref}}{\Delta V_{dd}} \approx R_2 \times \left[g_1 + g_2\left(\frac{g_{m1}}{g_{m2}}\right)\right] + \quad (23)$$

$$R_2 \cdot g_{NNRD} \times \left[\frac{g_2}{g_{m2}}(1 + R_1 g_{m1}) + R_1 g_1\right]$$

The first term on the RHS is due to current in $R_1$, while the second is for current through the NNRD. For the single cascode circuit in FIG. 7B, $$\frac{\Delta V_{ref}}{V_{dd}} \approx R_2 \times \left[\frac{g_1 g_2}{g_{m1}} + \frac{g_1 g_{M2} g_4}{g_{m1} g_{m4}} + \frac{g_3 g_{m2} g_4}{g_{m3} g_{m4}}\right] + \quad (24)$$

$$R_2 \cdot g_{NNRD} \times \left[(1 + R_1 g_{m2})\left(\frac{g_3 g_4}{g_{m3} g_{m4}} + \frac{g_1 g_4}{g_{m1} g_{m4}}\right) + \frac{R_1 g_1 g_2}{g_{m1}}\right]$$

The addition of a cascode stage modifies equation (23) by a factor of $g/g_m$. For $R_1 = 0$, the regulation of $I_{rtd}$ is similar to that obtained from the circuit 10, except for that the additional DFETs contribute extra terms to the effective conductance. As in the case of monostable biasing, for $R_1 \neq 0$ error terms arise from the feedback due to the voltage following property of the mirror, noting that $R_1 g_{m1} > 1$ in the case that $R_1$ is used for level matching.

From the monostable biasing criteria in equation (22), and the expressions for regulation of supply fluctuations (equations (23) and (24)), it is found that there are advantages to minimizing the incremental resistance of $Z_1$ (identified with $R_1$). However, it is also found that matching the source voltages of M1 and M2 (for the circuit 30) yields tolerance to a wider range of $V_{dd}$ than otherwise obtains.

Three possibilities for $Z_1$ were examined in circuit simulations: (1) $Z_1$ being a linear resistor $R_1 = V_p/I_p$ to provide level matching, with the supply rejection in $I_T$ being limited by the contribution from the current in $R_1$, (2) $Z_1 = 0$ identically, providing no level matching and requiring that the mirror current be limited via throttling with M3 (in the double-cascode version), and (3) $Z_1$ being the (small) dynamic resistance of a diode-connected DFET which provides level matching at a fairly low current level. As expected from topological considerations, case 2 results in device dimensions similar to those obtained in Type-I voltage references.

Cases 1 and 2 did not exhibit significant improvements in supply rejection, and relatively low (~1) current ratios were required for convergence. In case 3, introduction of a diode-connected DFET to replace $R_1$ improved regulation through two mechanisms. First, the low value of incremental impedance $Z_1$ minimized the effect of voltage following, and the level matching provided by the diode "turn-on" voltage permitted a mirror ratio of approximately $I_1:I_2 = 1:20$. The effect of the high ratio is to permit low currents to flow in the relatively unregulated side of the mirror, minimizing the effect on the regulation of the summed currents. The combination of high-ratio and low $Z_1$ yielded the best performance of the three cases, and simulations of the double cascode circuit 30 incorporate a diode-connected DFET in place of linear resistor $R_1$.

The expression for the temperature coefficient of the current through an ST-RTD biased with an ideal voltage source is rather cumbersome to be included herein. A simplification is possible if $R_{sh1} = \infty$ and $R_{ser} = R_{sd} = 0$, corresponding to an unmodified NNRD. Then the temperature coefficient of the current $I_j$ flowing in the NNRD, or through any device (or network) with a dc equivalent circuit composed of a dynamic (possibly non-linear) resistance $R_j$ in series with a linear resistor $R_s$ is $$\frac{dI_j[V_j,T]}{dT} = \left[\frac{R_j}{R_j + R_s}\right] \cdot \left(\frac{\partial I_j}{\partial T}\right)_{V_j} - \left[\frac{I_j}{R_j + R_s}\right] \cdot \frac{\partial R_s}{\partial T} \quad (25)$$

With $|R_j| > R_s$, the bracketed factor in the second term has the same sign as $R_j$, with the remaining quantities on the RHS of equation (25) exhibiting no dependence upon the sign of $R_j$. Therefore, the temperature coefficient can be improved by tailoring the magnitude and temperature coefficient of $R_{sd}$, and by selecting the operating point to achieve the desired sign for $R_j$.

In the high-fidelity simulations that follow $R_{sh1} = \infty$ and $R_{ser} = R_{sh1} = 0$, and the results correspond to an unmodified tunnel diode stabilized by a lossy ac shunt. The effect of temperature on $\{I_p, V_p\}$ is incorporated empirically based on data from a limited number of experimental devices. The model is consistent with the following observations: (1) That $V_p(T)$ and $I_p(T)$ have positive curvature with temperature (2) that the minima in $V_p(T)$ ($T_{min}^v$) and $I_p(T)$ ($T_{min}^i$) are offset by ~35° C. for the particular devices observed, and (3) the temperature at the minima varies inversely with x, the mole fraction of Al in the $Al_xGa_{1-x}As$ barriers. At $x = 0.4$, $T_{min}^v = 25°$ C. and ($T_{min}^i$) ≅80° C., while at $x = 1.0$, $T_{min}^v \approx 265°$ K. and ($T_{min}^i$) ≅230° K. Based upon this data, $T_{min}^i = 298°$ K. occurs for $x \approx 0.66$, consistent with the parabolic approximations $V_p[T] = 2.9783708 \times 10^{-6}(T-60)^2 + 0.6963515$ V and $I_p[T] = 3.2136752 \times 10^{-7}(T-25)^2 + 0.010$ A. These introduce temperature dependence in $I_{rtd}[V, T]$ via $$I_{rtd}[V,T] = -10.5 \frac{I_p[T]}{V_p[T]} (V - V_p[T])^2 + I_p[T] \quad (26)$$

Compensation of radiation effects is improved through a property inherent in all negative resistance devices, that the sign of the two terms in equation (25) can be selected based upon the sign of the dynamic resistance of the ST-NNRD in the operative state of the voltage reference. Adjustment of the state according to methods prescribed herein, or in copending U.S patent application Ser. No. 08/010,543 titled "Method of Optimizing a Circuit Utilizing a Negative Resistance Device", of common assignee, permits improvement to the response of the unadjusted circuit.

Process-induced variations in either DFETs or NNRDs result in deviations from the design properties of $V_{ref}$. Adjustment of the as-manufactured variation to achieve the design values of the effective curvature $\Gamma'$, the design value of $V_{dd}$ at which the maximum value of $V_{ref}$ is obtained, and the design value of $V_{ref}$, is effected by varying $R_s$, $R_{ser}$, and $R_{sh1}$.

The basic trimming strategy derives from the observations that increasing series resistance shifts the peak voltage to larger values with no change in peak current, and decreasing the value of parallel resistance increases both peak current and peak voltage, and that $|R_{dyn}^{min}|$ decreases with increasing series resistance, but increases with decreasing parallel resistance. Letting $V_p'''$ and $I_p'''$ denote the effective peak voltage and current of the ST-NNRD, in terms of the properties of the tunnel junction $[I_p, V_p]$ and the values of the series and parallel resistors, $$V_p''' = (V_p + I_p R_s) + \frac{1}{2|\kappa|R_{sh1}} + \quad (27)$$

$$R_{ser}\left(I_p + \frac{V_p + I_p R_s}{R_{sh1}} + \frac{1}{4|\kappa|R_{sh1}^2}\right)$$

$$I_p''' = I_p + \frac{V_p + I_p R_s}{R_{sh1}} + \frac{1}{4|\kappa|R_{sh1}^2} \quad (28)$$

For the case, in equation (13), in which the first term on the RHS is negative and larger in magnitude than $R_{ser}$, then increasing $R_{ser}$ will initially decrease the magnitude of $R_{dyn}^{min}$ towards zero, and there is a maximum value of $R_{ser}$ for which equation 5 is not violated.

Results of circuit simulations for circuit 10 will hereinafter be described. The square-law parameters for this simulation are nominally $\beta = 1.9 \times 10^{-4}$ A/V$^2$, $V_{th}$ 0.825 V, and $\lambda = 0.065$ V$^{-1}$. The RTD is described, in the region of the current peak, by $V_p = 0.7$ V, $I_p = 0.01$ A, and $\Gamma = -0.150$ A/V$^2$. Temperature dependence is incorporated via the expressions for $V_p[T]$, $I_p[T]$ and $I_{rtd}[V, T]$ developed previously.

Figure 9:
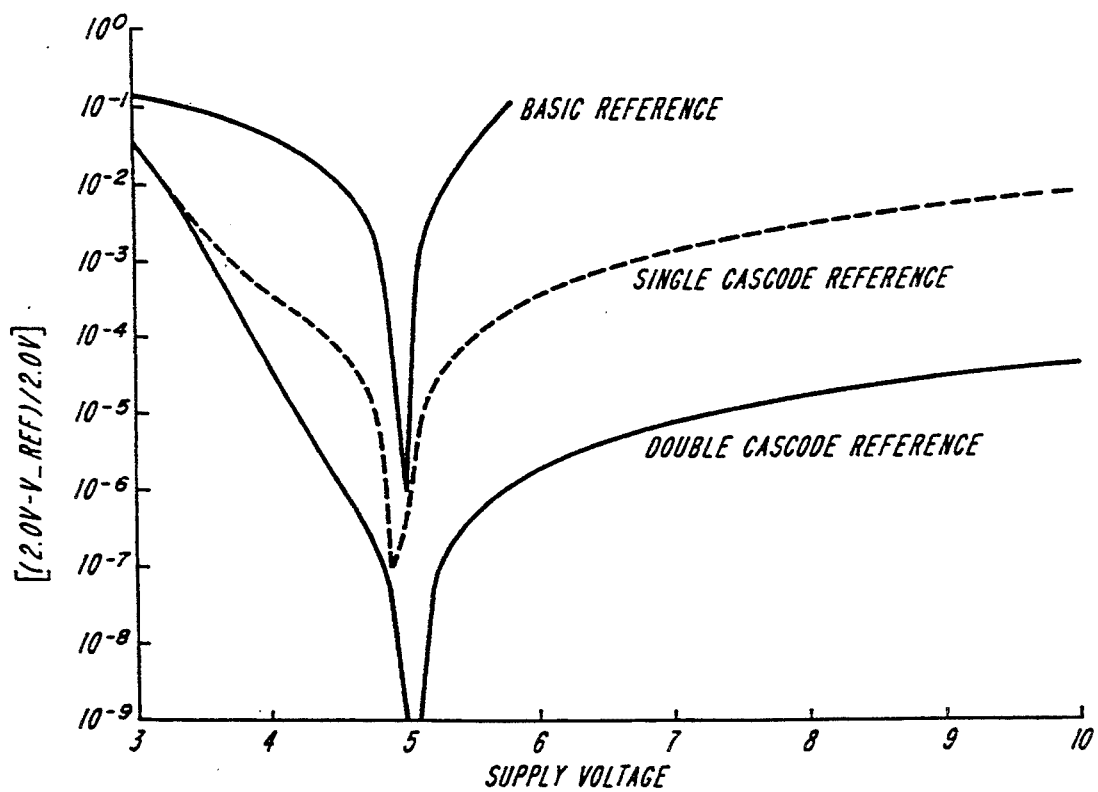
FIG. 9 shows a plot of the fractional error from $V_{ref}=2$ V versus $V_{dd}$ of the single-branch reference for the case of 0, 1 and 2 cascode stages.

FIG. 9 shows a plot of the fractional error from $V_{ref} = 2$ V versus $V_{dd}$ of the circuits in FIG. 2 for the case of 0, 1 and 2 cascode stages. For ±10% shifts about $V_{dd} = 5$ V the double cascode reference exhibits a 70 db improvement compared with existing references constructed in non-augmented MESFET technology.

Figure 12:
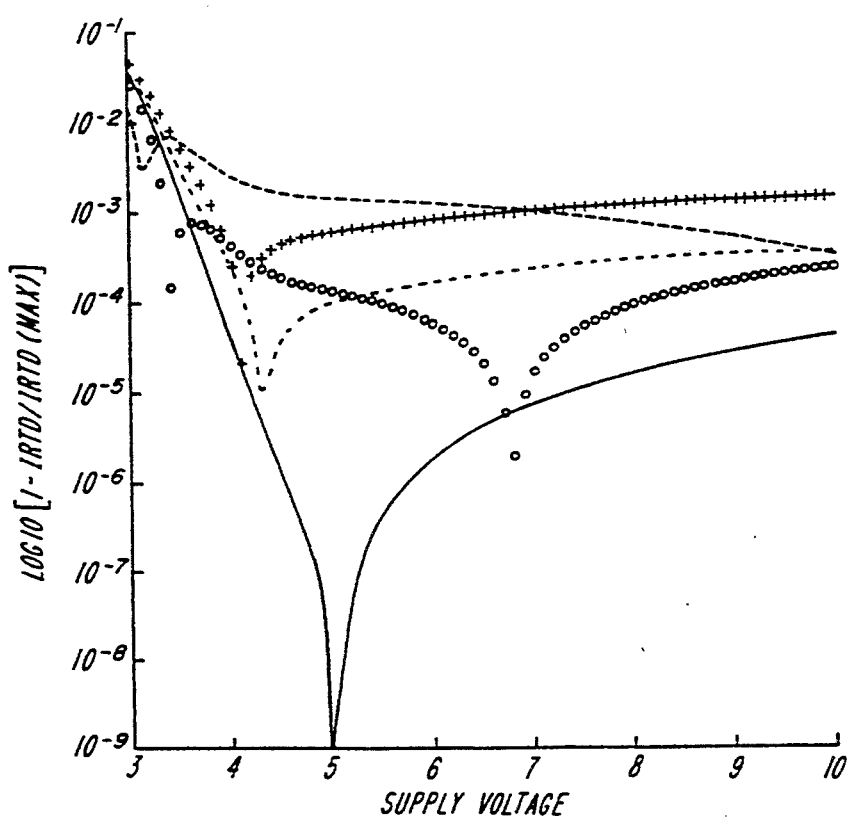
FIG. 12 shows a plot of temperature dependence of the reference voltage fractional error versus temperature for the circuit of FIG. 2B.

In this plot, and the plot shown in FIG. 12, the truncation of the non-cascode curves in the region of 5.6 V arises from the condition that $V_{gs}<V_{th}$ due to poor $V_{dd}$ rejection so that M1 is not in the forward active region of operation, resulting in a loadline which does not intersect the RTD I-V curve in the region of the current peak.

Figure 10:
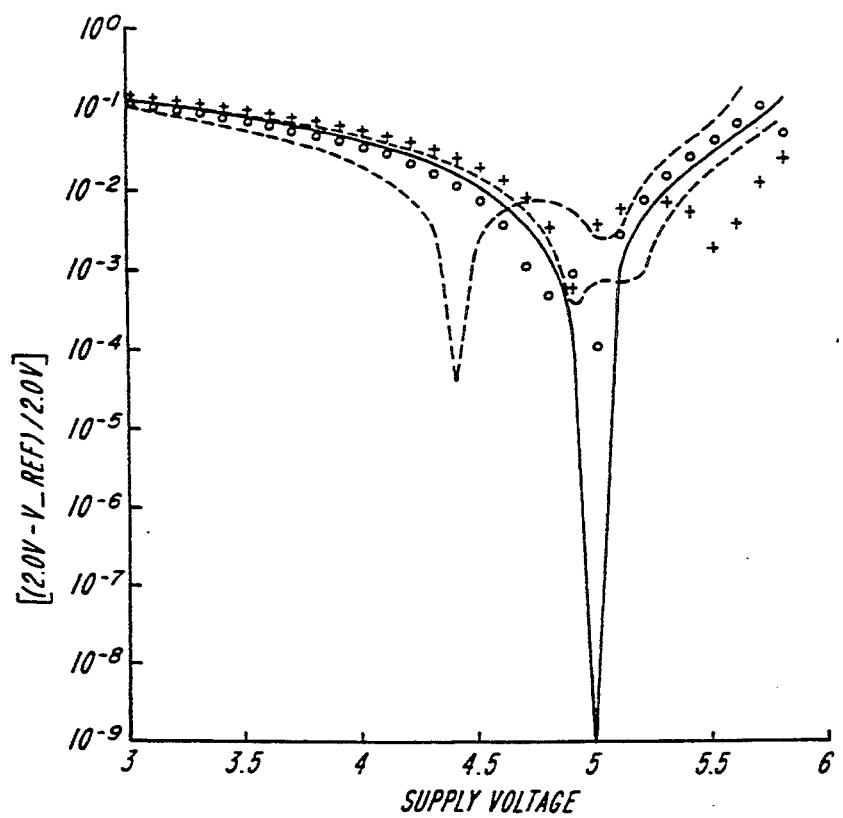
FIG. 10 shows a plot of temperature dependence of the reference voltage fractional error versus temperature for the circuit of FIG. 2A.
Figure 11:
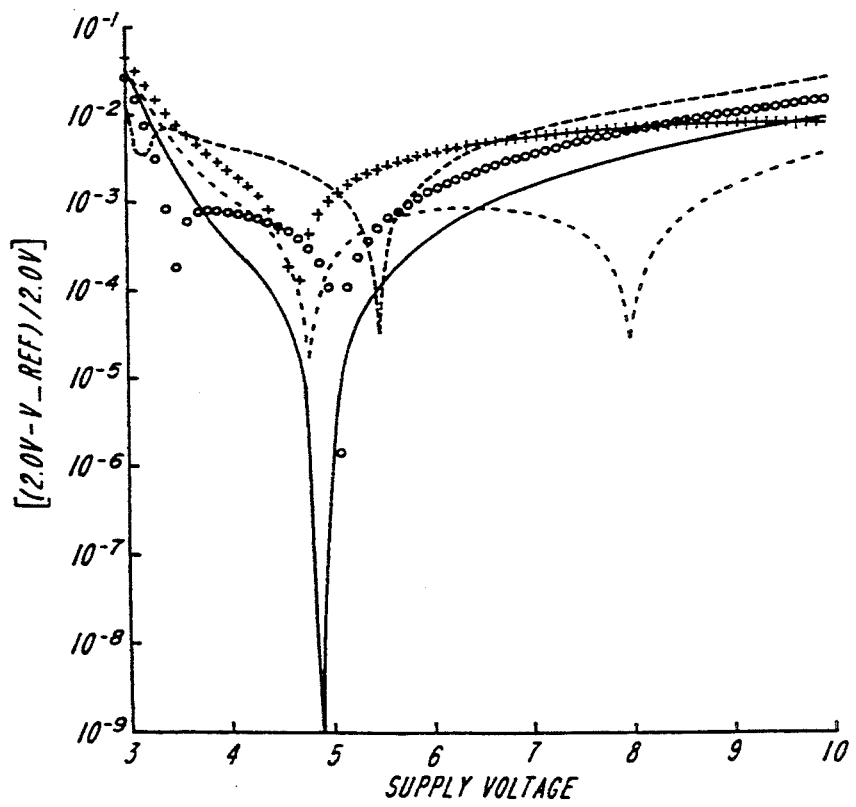
FIG. 11 shows a plot of temperature dependence of the reference voltage fractional error versus temperature for the circuit of FIG. 2B.

The calculation of $V_{ref}[V, T]$ from equation (26) yields the curves in FIGS. 10–12, indicating the absolute value of the fractional shift in $V_{ref}$ relative to 2 V versus $V_{dd}$ for deviations of 5 and 15 degrees about $T=25°$ C. The effects of temperature are mitigated by cascoding, with the plot of FIG. 10 exhibiting an average TC at $V_{dd}=5$ V of $\sim 2.7 \times 10^{-4}$ C$^{-1}$, compared with a TC of $\sim 7.4 \times 10^{-4}$ C$^{-1}$ for the reference.

The effects of varying curvature were simulated via a family of parabolic curves approximating the I-V curve of RTDs (or TDs) in the region of $\{I_p, V_p\}$, with $I_p=0.010$ A and $V_p$ ranging from 0.070 V − 0.70 V. As expected, it was found that as the curvature increased in magnitude, the regulation degraded, up to the point where the constraint in equation (14) were violated and the simulations no longer converged.

Figure 13:
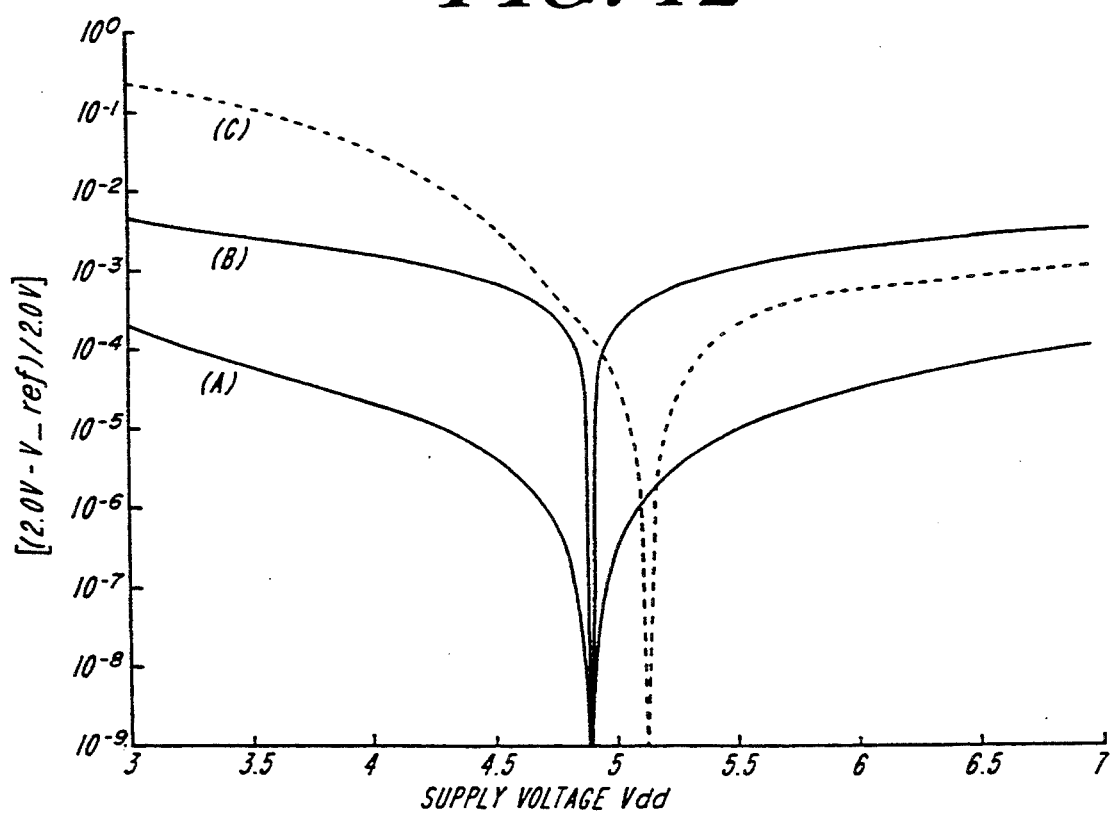
FIG. 13 shows a plot of the effect of supply variation on $I_{rtd}$ for the circuit of FIGS. 5B and 5C, each circuit being modified by the substitution of a diode-connected MESFET for $R_1$.

With respect to circuit simulations of circuit 30, the effect of supply variation on $I_{rtd}$ is shown in FIG. 13 for the circuit 30 of FIGS. 5B and 5C, each circuit being modified by the substitution of a diode-connected MESFET for $R_1$. While regulation of $I_{rtd}$ in the double cascode circuit compares well with regulation found in circuit 10, the regulation of the reference voltage shown in curve (C), which depends upon the sum of currents through both sides of the mirror, is not so favorable. The regulation in a double cascode circuit 30 is only comparable to a single cascode circuit 10. Note that in curve (C) a significant second order correction occurs with increasing $V_{dd}$, due to the summation of a decreasing $I_{rtd}$ with an increasing diode current. Replacement of $R_2$ by one or more diode-connected MESFETs in these circuits would further improve supply rejection in the reference voltage at the expense of having the reference voltage depending directly upon the stability and temperature coefficient of the Schottky barrier(s).

While supply rejection in the circuit 30 investigated here is poorer than that demonstrated by the exemplary circuit 10, the existence of an extra port (port 1) may permit substitution of alternative devices or subcircuits to effect temperature- or $V_{dd}$-compensation. In addition, the voltage-following property may permit trimming of the initial operating point without effecting changes in the compensation network which stabilizes the NNRD, or to permit the mirror to be used to dynamic signal transfer, converting voltage signals at port 1 to signals at port 2, or voltage signals across the summing resistor.

Criteria for realizing an NNRD-based bootstrap reference circuit are (1) that the NNRD be stabilized to preclude electrical oscillation when biased near a current peak or in a negative resistance region, (2) that the NNRD loadline impedance be small to effect monostable biasing and to preclude switching, (3) that means are provided for isolating the NNRD from supply fluctuations, (4) that the reference signal depend substantially upon the NNRD current, and (5) that the bias voltage for the NNRD depends upon the NNRD current. Herein will be described embodiments substantially satisfying criteria (1)–(4) above, and that are not restricted to completely monolithic integration of NNRDs with DFET circuits.

There is no restriction in principle to non-monolithic implementations provided the five criteria for realizing an NNRD-bootstrapped reference circuit are satisfied. Stability to electrical oscillation can be adversely impacted by parasitic inductance due to lead inductance in hybrid or discrete circuits. The requirement for low parasitic inductance can be lessened by decreasing the current density of the TD or RTD, thereby reducing the maximum frequency of oscillation. The inductance of connections from the NNRD to matching elements and the balance of the circuit can be reduced through the use of multiple (parallel) connections.

Particular processing techniques yield monolithically integrated active devices of one polarity, or in which one polarity of device offers significantly better performance than it's complement. In GaAs MESFET technology, it is presently the case that N-channel depletion-mode devices have better high-frequency characteristics than P-channel depltion-mode devices, due in part to the electron mobility being higher than that for holes. The circuits 10 and 30 of FIGS. 2A–2C and 7A–7C, while discussed with reference to GaAs MESFET performance, can be adapted to any technology incorporating DFETs, regardless of the operating principle of the devices involved (ie. JFET, MOSFET, HEMT etc.).

In principle, NNRDs can be incorporated monolithically in, but not limited to, silicon circuits, circuits incorporating group IV alloys (ie., silicon-germanium), III-V binary (ie., GaAs) or ternary alloys (Al$_x$Ga$_{1-x}$As), or combinations of these materials. An NNRD-bootstrapped reference can be realized under such conditions so long as the general criteria (1)–(5) are satisfied.

Limitations inherent in each device technology will determine the range of circuit topologies which can be implemented to satisfy these criteria. A critical feature delimiting the range of reference circuits is the presence (or absence) of complementary devices.

Accordingly, a new technique for generating well regulated reference currents and reference voltages is presented herein, applied here to MESFET circuits but applicable to any DFET technology, or to any technology permitting satisfaction of criteria (1)–(5) above for either discrete, hybrid or monolithic incorporation of an NNRD along with circuit simulations specific to GaAs MESFET devices commercially available. The most direct impact is for those DFET technologies, such as the GaAs MESFET, which lack high-quality voltage- or current-source devices.

Having shown illustrated embodiments, those skilled in the art will realize many variations are possible which will still be within the scope and spirit of the claimed invention. For example, non-monolithic, discrete or hybrid, implementations of the bootstrapped current and voltage reference circuits may be achieved by the teachings herein. Therefore, it is the intention to limit the invention only as indicated by the scope of the claims.

What is claimed is:

1. A bootstrap current reference circuit comprising:
   an n-type negative resistance network which exhibits at least one predetermined current peak; and
   biasing means responsive to operating current of said n-type negative resistance network for biasing said network to operate as a current source at an operating point substantially in a region of said at least one predetermined current peak associated with said n-type negative resistance network.

2. The circuit of claim 1, wherein said biasing means is further responsive to operating voltage across said n-type negative resistance network.

3. The circuit of claim 1, wherein said n-type negative resistance network comprises a stable trimmed n-type negative resistance device.

4. The circuit of claim 3 further comprising means for transforming the current of said stable trimmed n-type negative resistance device into a reference voltage.

5. The circuit of claim 3, wherein said stable trimmed n-type negative resistance device comprises a tunnel diode.

6. The circuit of claim 3, wherein said stable trimmed n-type negative resistance device comprises a resonant tunneling diode.

7. The circuit of claim 3, wherein said stable trimmed n-type negative resistance device comprises a transistor incorporating a tunneling barrier in order to exhibit n-type negative resistance device current-voltage characteristics.

8. The circuit of claim 3, wherein said biasing means comprises a depletion mode field effect transistor coupled to said stable trimmed n-type negative resistance network at the source node of said transistor.

9. The circuit of claim 1, wherein said biasing means comprises a transistor coupled to an input of said negative resistance network.

10. The circuit of claim 9, wherein an output of said negative resistance network is coupled to said transistor such that transistor is responsive to the current through said negative resistance network.

11. The circuit of claim 10, wherein an output of said negative resistance network is coupled to said transistor such that transistor is responsive to the voltage across said negative resistance network.

12. The circuit of claim 9, wherein said transistor comprises a first depletion mode field effect transistor.

13. The circuit of claim 12, wherein said first depletion mode field effect transistor includes a source node coupled to said input of said negative resistance network, and a gate node coupled to said output of said negative resistance device.

14. The circuit of claim 13, wherein said biasing means further comprises a second depletion mode field effect transistor having a source node coupled in series with said drain node of said first depletion mode field effect transistor, and a gate node coupled to said input of said negative resistance network.

15. The circuit of claim 1, wherein said biasing means comprises a series of cascode amplifier stages coupled to said biasing means.

16. The circuit of claim 1, wherein said biasing means comprises a current mirror.

17. The circuit of claim 16, wherein said biasing means comprises a negative inverting current mirror.

18. The circuit of claim 17, wherein said current mirror comprises first and second depletion mode field effect transistors.

19. The circuit of claim 18, wherein the input of said negative resistance network is coupled to the source node of said second transistor and to the gate node of said first transistor.

20. The circuit of claim 16, wherein said biasing means further comprises a series of cascode amplifier stages coupled to said current mirror.

* * * * *